United States Patent
Wu (10) Patent No.: US 8,391,438 B2
(45) Date of Patent: Mar. 5, 2013

(54) METHOD AND APPARATUS FOR CLOCK FREQUENCY DIVISION

(75) Inventor: Xuesong Wu, Shenzhen (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 0 days.

(21) Appl. No.: 13/520,153

(22) PCT Filed: Sep. 17, 2010

(86) PCT No.: PCT/CN2010/077062
§ 371 (c)(1),
(2), (4) Date: Jun. 29, 2012

(87) PCT Pub. No.: WO2011/079630
PCT Pub. Date: Jul. 7, 2011

(65) Prior Publication Data
US 2012/0275559 A1   Nov. 1, 2012

(30) Foreign Application Priority Data
Dec. 29, 2009   (CN) .......................... 2009 1 0261738

(51) Int. Cl.
*H03K 21/00* (2006.01)
(52) U.S. Cl. ............. 377/48; 327/115; 327/117; 377/47
(58) Field of Classification Search .......... 327/113–115, 327/117, 118; 377/47, 48
See application file for complete search history.

(56) References Cited

U.S. PATENT DOCUMENTS

| | | | |
|---|---|---|---|
| 6,707,866 B1 | 3/2004 | Ito | |
| 6,795,519 B2 * | 9/2004 | Chakravarthy | 377/48 |
| 6,882,698 B2 * | 4/2005 | Mukaide | 377/48 |
| 7,164,297 B2 * | 1/2007 | Flynn | 327/107 |
| 7,512,208 B2 * | 3/2009 | Noeske | 377/47 |

FOREIGN PATENT DOCUMENTS

| | | |
|---|---|---|
| CN | 1485985 A | 3/2004 |
| CN | 1642011 A | 7/2005 |
| CN | 101783676 A | 7/2010 |
| JP | 2006268617 A | 10/2006 |

OTHER PUBLICATIONS

P.R. China, State Intellectual Property Office, International Search Report for International Application No. PCT/CN2010/077062, mailed Dec. 30, 2010.

* cited by examiner

*Primary Examiner* — Patrick O'Neill
(74) *Attorney, Agent, or Firm* — Bright IP Law Offices (57) ABSTRACT

The present invention discloses a method and apparatus for clock frequency division, the method comprises: determining a current frequency division coefficient in real time according to input clock signals and output clock information; then, performing counting on the input clock signals according to an integer portion and a decimal portion of the frequency division coefficient and a decimal scale threshold of the decimal portion; and performing accumulation on the decimal portion according to the counting result; finally, controlling the output clock according to the counting result and the accumulation result. With the method and the apparatus, output signals can be adjusted dynamically according to input signals, and the bit width of the integer portion and the decimal portion of the frequency division coefficient and the decimal scale threshold of the decimal portion can be increased on demand, so that the precision of the frequency division coefficient can be adjusted.

15 Claims, 5 Drawing Sheets

METHOD AND APPARATUS FOR CLOCK FREQUENCY DIVISION

CROSS REFERENCE TO RELATED APPLICATIONS

This application is the U.S. National Stage of International Patent Application No. PCT/CN2010/077062 filed on Sep. 17, 2010, which claims priority to Chinese Patent Application No. 200910261738.2 filed on Dec. 29, 2009. Both the PCT Application and Chinese Application are hereby incorporated by reference in their entirety.

FIELD OF THE INVENTION

The present invention relates to a clock frequency division technology, and more particularly to a method and an apparatus for clock frequency division.

BACKGROUND OF THE INVENTION

In the communication field, a frequency divider is required for the realization of clock frequency division, wherein the principle of the frequency divider is that: each time when int($\Sigma b$) is accumulated to be an integer, the frequency divider will add an input clock cycle Ti to frequency division time of an output clock cycle To according to Formula (1), which will shorten the output clock cycle To.

$$\Sigma To = (\Sigma a + \text{int}(\Sigma b))^* Ti + \text{mod}(\Sigma b)^* Ti \quad (1)$$

Wherein, mod indicates a modulus function, int indicates an integral function, Ti represents the input clock cycle, to represents the output clock cycle, a is an integer portion after frequency division processing, and b is a decimal portion after frequency division processing.

In practical application, the decimal portion b after the frequency division processing performed by the frequency divider is generally separated to be processed as an integer portion, which can be applied in network communications, such as the circuit emulation service of the packet switch network, so as to recover the clock of the source end at the receiver terminals.

At present, the specific method for decimal frequency division is as follows.

First of all, the integer portion ai and the decimal portion bi of the current frequency division are determined according to a current frequency division coefficient Ki in Formula (2), and a decimal scale threshold ci is determined according to the determined decimal portion bi. As required by the precision, the decimal portion bi can be represented by an 8-bit, 12-bit, 16-bit or 32-bit value, etc., for example, if the decimal portion bi is a hexadecimal value, the corresponding decimal scale threshold ci is 3B9ACA00.

$$Ki = \frac{Fi}{Fo} = \frac{To}{Ti} = ai + bi \quad (2)$$

Then the output clock frequency Fo is obtained based on the input clock frequency Fi according to the Formula (2) with the determined integer portion ai of the current frequency division, decimal portion bi of the current frequency division and current value of the decimal scale threshold ci of the current frequency division, so as to recover the clock frequency of the source end at the receiver terminals.

The clock frequency division method above is completed on the basis of the hypothesis that the frequency division coefficient Ki is fixed. It can be used only in the situation where the frequency division coefficient is fixed; moreover, the decimal portion bi generally supports the value precision of 1 bit or 2 bits only. The frequency division precision is low, which makes it hard to meet the requirements of high frequency division precision, multi bit decimal portion and the dynamic adjustment of the frequency division coefficient in the clock recovery application in the communication field such as the packet switch network.

SUMMARY OF THE INVENTION

In view of the above, the present invention provides a method and an apparatus for clock frequency division, which can raise the frequency division precision and meet the requirements of the dynamic adjustment of the frequency division coefficient.

The present invention adopts the technical solution as follows.

The present invention provides a method for clock frequency division, comprising: determining a current frequency division coefficient according to a current input clock frequency and a current output clock frequency, outputting an integer portion and a decimal portion of the frequency division coefficient, and obtaining a decimal scale threshold of the decimal portion; performing counting on input clock signals, and outputting a counting indication according to a counting result and the integer portion of the frequency division coefficient; performing accumulation on the decimal portion of the frequency division coefficient according to the counting indication, and outputting an accumulation indication according to an accumulation result and the decimal scale threshold; and controlling an output clock level according to the counting indication and the accumulation indication.

In the above solution, the method comprises: performing counting on the input clock signals, and outputting an end indication of the current counting when the counting result is equal to the integer portion of the frequency division coefficient; performing accumulation on the decimal portion of the frequency division coefficient when the counting indication is the end indication of the counting, and outputting an end indication of the accumulation when the accumulation result is equal to the decimal scale threshold; and if the accumulation indication is the end indication of the accumulation, driving the output clock level to be high after delaying one clock cycle.

In the above solution, the method further comprises: outputting an indication of half counting when the counting result is equal to integer digits of half of the integer portion of the frequency division coefficient; and driving the output clock level to be low when the counting indication is the indication of half counting.

In the above solution, the step of controlling the output clock level according to the counting indication and the accumulation indication comprises: directly driving the output clock level to be high when the counting indication is the end indication of the counting and no end indication of the accumulation is output.

The present invention also provides an apparatus for clock frequency division, comprising: a determination unit, configured to determine a current frequency division coefficient according to a current input clock frequency and a current output clock frequency, and respectively output an integer portion and a decimal portion of the current frequency division coefficient and a decimal scale threshold of the decimal portion; a counting unit, configured to perform counting on input clock signals, and output a counting indication according to a counting result and the integer portion of the current frequency division coefficient output by the determination unit; an accumulation unit, configured to perform accumulation on the decimal portion output by the determination unit according to the counting indication output by the counting unit, and output an accumulation indication according to the decimal scale threshold output by the determination unit and an accumulation result; and an output clock control unit, configured to control an output clock level according to the counting indication output by the counting unit and the accumulation indication output by the accumulation unit.

In the above solution, the counting unit is configured to: perform counting on the input clock signals, and output an end indication of the current counting when the counting result is equal to the integer portion of the current frequency division coefficient output by the determination unit.

In the above solution, the accumulation unit is configured to: perform accumulation on the decimal portion output by the determination unit when the end indication of the current counting is output by the counting unit; and output an end indication of the accumulation when the accumulation result is no less than the decimal scale threshold output by the determination unit.

In the above solution, the counting unit is further configured to clear the counting result after outputting the end indication of the current counting.

In the above solution, the counting unit is further configured to: output an indication of half counting when the counting result is equal to integer digits of half of the received integer portion of the current frequency division coefficient output by the determination unit.

In the above solution, the output clock control unit is configured to: when receiving the end indication of the accumulation output by the accumulation unit, drive the output clock level to be high after delaying one clock cycle; when receiving the end indication of the counting output by the counting unit and the accumulation unit does not output the end indication of the accumulation, directly drive the output clock level to be high; when receiving the indication of half counting output by the counting unit, drive the output clock level to be low.

The present invention determines the current frequency division coefficient in real time according to input clock signals and output clock information, performs counting on the input clock signals according to the integer portion and the decimal portion of the frequency division coefficient as well as the decimal scale threshold of the decimal portion, and then performs accumulation on the decimal portion according to the counting result, at last controls the output clock according to the counting result and the accumulation result, in this way, the output signals can be dynamically adjusted according to the input signals. In the present invention, the bit width of the integer portion and the decimal portion of the frequency division coefficient and the decimal scale threshold of the decimal portion can be increased on demand, so that the precision of the frequency division coefficient can be adjusted.

DETAILED DESCRIPTION OF THE EMBODIMENTS

Figure 1:
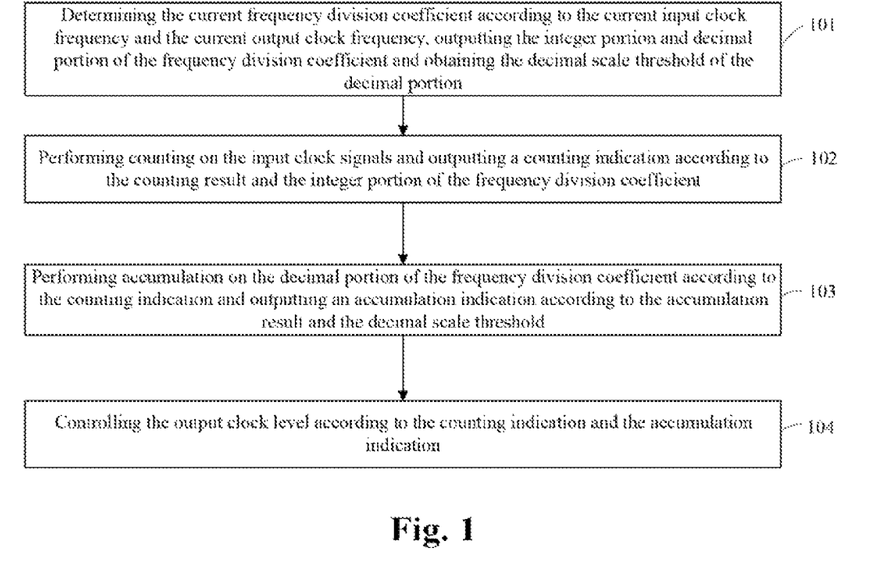
FIG. 1 is a schematic diagram of the realization procedure of the method for clock frequency division according to an embodiment of the present invention.

The method for clock frequency division according to an embodiment of the present invention, as shown in FIG. 1, mainly comprises the following steps.

Step 101: a current frequency division coefficient is determined according to a current input clock frequency and a current output clock frequency, an integer portion and a decimal portion of the frequency division coefficient are output, and a decimal scale threshold of the decimal portion is obtained.

In this step, the current frequency division coefficient can be determined in real time based on the actual frequencies of the input clock and output clock according to the actual application requirements.

In the above, the decimal scale threshold can be obtained according to the number of bits of the decimal portion of the frequency division coefficient and the numeration system. For example, if the decimal portion of the frequency division coefficient adopts decimal system, the number of bits of the decimal portion are 2, thus the decimal scale threshold is 100.

In practical application, the bit width of the integer portion and the decimal portion of the frequency division coefficient and the decimal scale threshold of the decimal portion can be increased on demand, so that the precision of the frequency division coefficient can be adjusted.

Step 102: counting is performed on input clock signals, and a counting indication is output according to the counting result and the integer portion of the frequency division coefficient.

In this step, the process of outputting the counting indication according to the counting result and the integer portion of the frequency division coefficient can be specifically as follows: performing counting on the input clock signals and outputting an end indication of the current counting when the counting result is equal to the integer portion of the frequency division coefficient; outputting an indication of half counting when the counting result is equal to integer digits of half of the integer portion of the frequency division coefficient.

Herein, the end indication of the current counting can be a high-level pulse signal generated when the counting result is equal to the integer portion of the frequency division coefficient, or can be a digit indication with the value being 1. The indication of half counting can be a high-level pulse signal generated when the counting result is equal to the integer digits of half of the integer portion of the frequency division coefficient, or can be a digit indication with the value being 1.

Step 103: accumulation is performed on the decimal portion of the frequency division coefficient according to the counting indication, and an accumulation indication is output according to the accumulation result and the decimal scale threshold.

In this step, the process of performing accumulation on the decimal portion of the frequency division coefficient according to the counting indication is specifically as follows: performing accumulation on the decimal portion of the frequency division coefficient when the counting indication is the end indication of the counting.

In this step, the process of outputting the accumulation indication according to the accumulation result and the decimal scale threshold is specifically as follows: outputting the end indication of the accumulation when the accumulation result is equal to the decimal scale threshold.

Herein, the end indication of the accumulation can be a high-level pulse signal generated when the accumulation result is equal to the decimal scale threshold, or can be a digit indication with the value being 1.

Step 104: an output clock level is controlled according to the counting indication and the accumulation indication.

In this step, the process of controlling the output clock level according to the counting indication and the accumulation indication is specifically as follows: when the accumulation indication is the end indication of the accumulation, driving the output clock level to be high after delaying one clock cycle; when the counting indication is the end indication of the counting and no end indication of the accumulation is output, directly driving the output clock level to be high; when the counting indication is the indication of half counting, driving the output clock level to be low.

Figure 2:
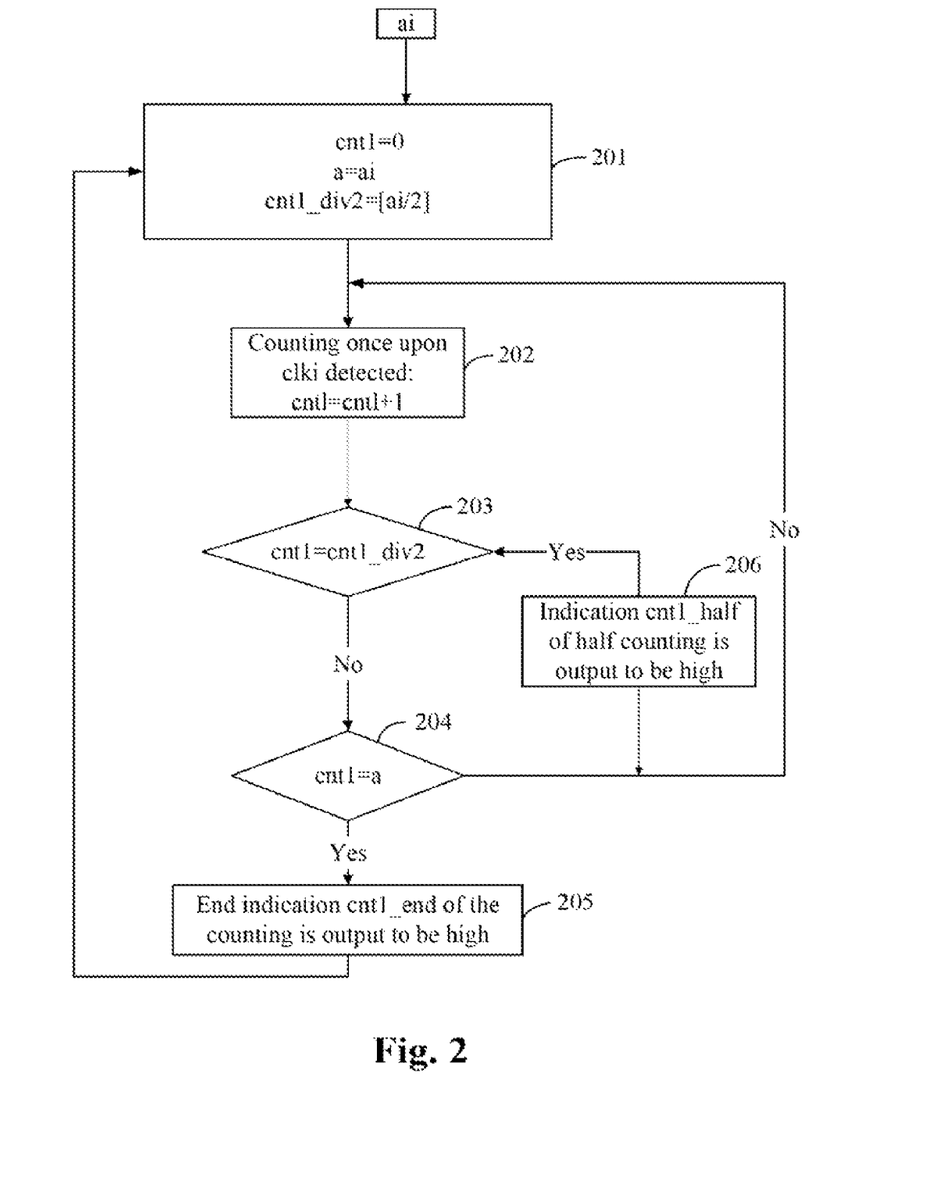
FIG. 2 is a schematic diagram of the detailed procedure of the counting process realization according to an embodiment of the present invention.

Specifically, as shown in FIG. 2, the realization of the counting process in Step 102 specifically comprises the steps below.

Step 201: the counting result cnt1 is cleared, the target value a of the counting is updated to be the integer portion ai of the current frequency division coefficient, and the value of the variable cut1_div2 is updated to be the integer digits obtained by dividing the integer portion ai of the current frequency division coefficient by 2.

Alternatively, when half of the integer portion ai of the current frequency division coefficient is not an integer, the value of cnt1_div2 can be determined to be the integer obtained by adding 1 to the integer digits of half of ai, so as to ensure the duty ratio of the high & low levels of the output clock within one clock cycle keeps 50% during the whole frequency division processing if possible.

Step 202: counting is performed on the input clock signals clki, each time when one input clock signal clki is detected, count once and add 1 to cnt1.

Step 203: it is judged whether the value of cnt1 is equal to cnt1_div2, if equal, jump to Step 206; if not, enter Step 204.

Step 204: it is judged whether the value of cnt1 is equal to a, if equal, enter Step 205; if not, return to Step 202, Step 205: an end indication cnt1_end, which is a high-level pulse signal, of the current counting is output, and return to Step 201.

Step 206: an indication cnt1_half, which is a high-level pulse signal, of half counting is output, and return to Step 202.

Figure 3:
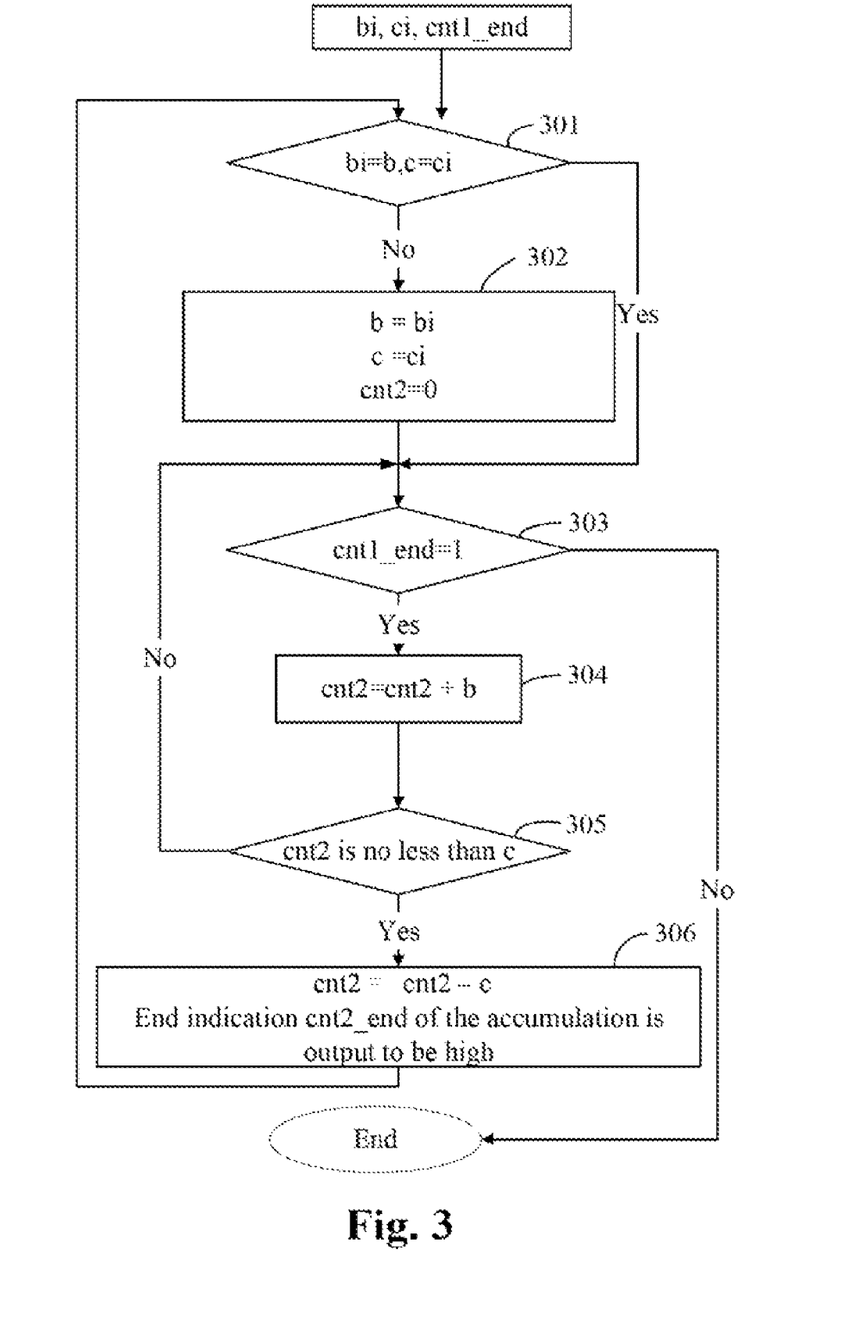
FIG. 3 is a schematic diagram of the detailed procedure of the accumulation process realization according to an embodiment of the present invention.

Specifically, as shown in FIG. 3, the realization of the accumulation process in Step 103 comprises the steps below.

Step 301: it is judged whether the decimal portion bi of the input current frequency division coefficient is equal to the current accumulation value b, and whether the input decimal scale threshold is equal to the threshold c of the current accumulation value, if equal, jump to Step 303; if not, enter Step 302.

Step 302: the accumulation value b is updated to be the decimal portion bi of the current frequency division coefficient, the threshold c of the accumulation value is updated to be the current decimal scale threshold ci, and the accumulation result cnt2 is cleared.

Step 303: it is judged whether the input cnt1_end is high level, if yes, enter Step 304; if not, end the current procedure.

Step 304: b is accumulated onto the accumulation result cnt2.

Step 305: it is judged whether cnt2 is not less than c, if cnt2 is not less than c, enter Step 306; if cnt2 is less than c, return to Step 303.

Step 306: cnt2 is updated to be the difference obtained by subtracting c from cnt2, and an end indication cnt2_end, which is a high-level pulse signal, of the current counting is output, and return to Step 301.

Figure 4:
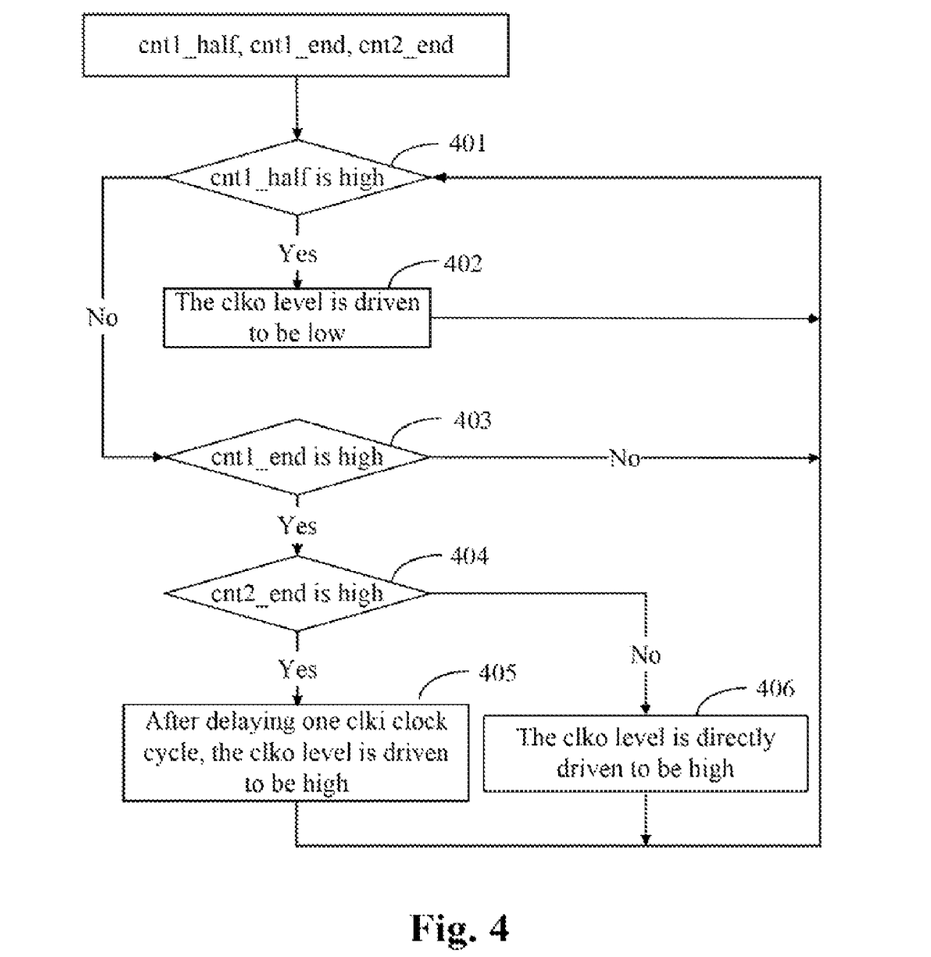
FIG. 4 is a schematic diagram of the detailed procedure of the realization of the output clock control process according to an embodiment of the present invention.

Specifically, as shown in FIG. 4, the realization of the output clock level control process in Step 104 comprises the steps below.

Step 401: it is judged whether cnt1_half is high level, if yes, enter Step 402; if not, jump to Step 403.

Step 402: the level of the output clock clko is driven to be low, and return to Step 401.

Step 403: it is judged whether cnt1_end is high level, if yes, enter Step 404; if not, return to Step 401.

Step 404: it is judged whether cnt2_end is high level, if yes, enter Step 405; if not, jump to Step 406.

Step 405: after delaying one clock cycle of an input clock clki, the level of the output clock clko is driven to be high, and return to Step 401.

Step 406: the level of the output clock clko is directly driven to be high, and return to Step 401.

In practical application, when the frequencies of the current input clock and output clock have any change, and the current frequency division coefficient requires re-determination, the clock frequency division processing procedure above shall be repeated.

Figure 5:
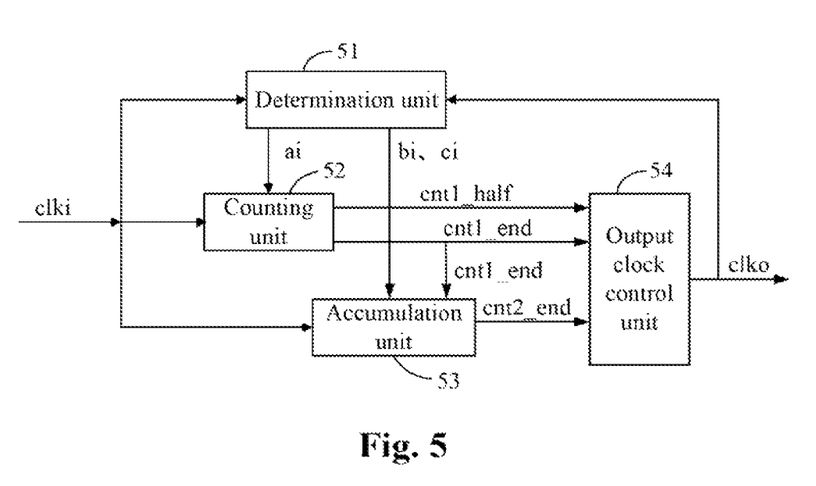
FIG. 5 is a schematic diagram of the structure of the apparatus for clock frequency division according to an embodiment of the present invention.

To realize the method above, an apparatus for clock frequency division is also provided by an embodiment of the present invention. As shown in FIG. 5, the apparatus mainly comprises: a determination unit 51, a counting unit 52, an accumulation unit 53 and an output clock control unit 54, wherein the determination unit 51 is used to determine a current frequency division coefficient according to a current input clock frequency and a current output clock frequency, and output an integer portion ai and a decimal portion bi of the current frequency division coefficient and a decimal scale threshold ci of the decimal portion bi; the counting unit 52 is used to perform counting on the input clock (clki) signals and output a counting indication according to the integer portion ai of the current frequency division coefficient output by the determination unit 51 and the counting result, the counting indication herein comprises an end indication cnt1_end of the counting and an indication cnt1_half of half counting; the accumulation unit 53 is used to perform accumulation on the decimal portion bi output by the determination unit 51 according to the counting indication output by the counting unit 52, and output an accumulation indication according to the decimal scale threshold ci output by the determination unit 51 and the accumulation result, the accumulation indication herein comprises an end indication cnt2_end of the accumulation; the output clock control unit 54 is used to control the output clock level according to the counting indication output by the counting unit 52 and the accumulation indication output by the accumulation unit 53.

In the above, the counting unit 52 is specifically used to: perform counting on the input clock signals, and output the end indication cnt1_end of the counting when the counting result is equal to the integer portion of the current frequency division coefficient output by the determination unit 51.

Herein, the counting unit 52 is also used to: clear the counting result after outputting the end indication cnt1_end of the counting.

In the above, the counting unit 52 is also used to: output the indication cnt1_half of half counting when the counting result is equal to the integer digits of half of the integer portion of the current frequency division coefficient output by the determination unit 51.

In the above, the accumulation unit 53 is specifically used to: perform accumulation on the decimal portion output by the determination unit 51 when the end indication cnt1_end of the counting is output by the counting unit 52; and output the end indication cnt2_end of the accumulation when the accumulation result is no less than the decimal scale threshold output by the determination unit 51.

In the above, the output clock control unit 54 is specifically used to: when receiving the end indication cnt2_end of the accumulation output by the accumulation unit 53, drive the level of the output clock clko to be high after delaying one clock cycle; when receiving the end indication cnt1_end of the counting output by the counting unit 52 and the accumulation unit 53 does not output the end indication of the accumulation, directly drive the level of the output clock clko to be high; when receiving the indication cnt1_half of half counting output by the counting unit 52, drive the level of the output clock clko to be low.

In practical applications, the realization process of the clock frequency division processing of the apparatus for clock frequency division according to the embodiment of the present invention has been illustrated above, so no details will be given herein.

The above is just the preferred embodiments of the present invention, not intended to limit the protection scope of the present invention. Any modification, alternation and improvement within the principles of the present invention shall be included in the protection scope of the present invention.

What is claimed is:

1. A method for clock frequency division, comprising:
    determining a current frequency division coefficient according to a current input clock frequency and a current output clock frequency, outputting an integer portion and a decimal portion of the frequency division coefficient, and obtaining a decimal scale threshold of the decimal portion;
    performing counting on input clock signals, and outputting a counting indication according to a counting result and the integer portion of the frequency division coefficient;
    performing accumulation on the decimal portion of the frequency division coefficient according to the counting indication, and outputting an accumulation indication according to an accumulation result and the decimal scale threshold; and
    controlling an output clock level according to the counting indication and the accumulation indication.

2. The method for clock frequency division as claimed in claim 1, comprising:
    performing counting on the input clock signals, and outputting an end indication of the current counting when the counting result is equal to the integer portion of the frequency division coefficient;
    performing accumulation on the decimal portion of the frequency division coefficient when the counting indication is the end indication of the counting, and outputting an end indication of the accumulation when the accumulation result is equal to the decimal scale threshold; and
    if the accumulation indication is the end indication of the accumulation, driving the output clock level to be high after delaying one clock cycle.

3. The method for clock frequency division as claimed in claim 2, further comprising:
    outputting an indication of half counting when the counting result is equal to integer digits of half of the integer portion of the frequency division coefficient; and
    driving the output clock level to be low when the counting indication is the indication of half counting.

4. The method for clock frequency division as claimed in claim 3, wherein the step of controlling the output clock level according to the counting indication and the accumulation indication comprises:
    directly driving the output clock level to be high when the counting indication is the end indication of the counting and no end indication of the accumulation is output.

5. The method for clock frequency division as claimed in claim 2, wherein the step of controlling the output clock level according to the counting indication and the accumulation indication comprises:
    directly driving the output clock level to be high when the counting indication is the end indication of the counting and no end indication of the accumulation is output.

6. An apparatus for clock frequency division, comprising:
    a determination unit, configured to determine a current frequency division coefficient according to a current input clock frequency and a current output clock frequency, and respectively output an integer portion and a decimal portion of the current frequency division coefficient and a decimal scale threshold of the decimal portion;
    a counting unit, configured to perform counting on input clock signals, and output a counting indication according to a counting result and the integer portion of the current frequency division coefficient output by the determination unit;
    an accumulation unit, configured to perform accumulation on the decimal portion output by the determination unit according to the counting indication output by the counting unit, and output an accumulation indication according to the decimal scale threshold output by the determination unit and an accumulation result; and
    an output clock control unit, configured to control an output clock level according to the counting indication output by the counting unit and the accumulation indication output by the accumulation unit.

7. The apparatus for clock frequency division as claimed in claim 6, wherein the counting unit is configured to:
    perform counting on the input clock signals, and output an end indication of the current counting when the counting result is equal to the integer portion of the current frequency division coefficient output by the determination unit.

8. The apparatus for clock frequency division as claimed in claim 7, wherein the accumulation unit is configured to:
    perform accumulation on the decimal portion output by the determination unit when the end indication of the current counting is output by the counting unit; and output an end indication of the accumulation when the accumulation result is no less than the decimal scale threshold output by the determination unit.

9. The apparatus for clock frequency division as claimed in claim 8, wherein the output clock control unit is configured to:
    when receiving the end indication of the accumulation output by the accumulation unit, drive the output clock level to be high after delaying one clock cycle;
    when receiving the end indication of the counting output by the counting unit and the accumulation unit does not output the end indication of the accumulation, directly drive the output clock level to be high; and when receiving an indication of half counting output by the counting unit, drive the output clock level to be low.

10. The apparatus for clock frequency division as claimed in claim 7, wherein the counting unit is further configured to clear the counting result after outputting the end indication of the current counting.

11. The apparatus for clock frequency division as claimed in claim 10, wherein the output clock control unit is configured to:

when receiving an end indication of the accumulation output by the accumulation unit, drive the output clock level to be high after delaying one clock cycle;

when receiving the end indication of the counting output by the counting unit and the accumulation unit does not output the end indication of the accumulation, directly drive the output clock level to be high; and when receiving an indication of half counting output by the counting unit, drive the output clock level to be low.

12. The apparatus for clock frequency division as claimed in claim 7, wherein the output clock control unit is configured to:

when receiving an end indication of the accumulation output by the accumulation unit, drive the output clock level to be high after delaying one clock cycle;

when receiving the end indication of the counting output by the counting unit and the accumulation unit does not output the end indication of the accumulation, directly drive the output clock level to be high; and when receiving an indication of half counting output by the counting unit, drive the output clock level to be low.

13. The apparatus for clock frequency division as claimed in claim 6, wherein the counting unit is further configured to:

output an indication of half counting when the counting result is equal to integer digits of half of the received integer portion of the current frequency division coefficient output by the determination unit.

14. The apparatus for clock frequency division as claimed in claim 13, wherein the output clock control unit is configured to:

when receiving an end indication of the accumulation output by the accumulation unit, drive the output clock level to be high after delaying one clock cycle;

when receiving an end indication of the counting output by the counting unit and the accumulation unit does not output the end indication of the accumulation, directly drive the output clock level to be high; and when receiving the indication of half counting output by the counting unit, drive the output clock level to be low.

15. The apparatus for clock frequency division as claimed in claim 6, wherein the output clock control unit is configured to:

when receiving an end indication of the accumulation output by the accumulation unit, drive the output clock level to be high after delaying one clock cycle;

when receiving an end indication of the counting output by the counting unit and the accumulation unit does not output the end indication of the accumulation, directly drive the output clock level to be high; and when receiving an indication of half counting output by the counting unit, drive the output clock level to be low.

* * * * *